US007239067B2

(12) United States Patent
Komuro et al.

(10) Patent No.: US 7,239,067 B2
(45) Date of Patent: Jul. 3, 2007

(54) METHOD OF MANUFACTURING A PIEZOELECTRIC THIN FILM RESONATOR, MANUFACTURING APPARATUS FOR A PIEZOELECTRIC THIN FILM RESONATOR, PIEZOELECTRIC THIN FILM RESONATOR, AND ELECTRONIC COMPONENT

(75) Inventors: Eiju Komuro, Tokyo (JP); Hisatoshi Saitou, Tokyo (JP); Takao Noguchi, Tokyo (JP); Masaaki Imura, Tokyo (JP)

(73) Assignee: TDK Corporation, Tokyo (JP)

( * ) Notice: Subject to any disclaimer, the term of this patent is extended or adjusted under 35 U.S.C. 154(b) by 274 days.

(21) Appl. No.: 10/811,812

(22) Filed: Mar. 30, 2004

(65) Prior Publication Data
US 2004/0191947 A1 Sep. 30, 2004

(30) Foreign Application Priority Data
Mar. 31, 2003 (JP) ............................. 2003-094569

(51) Int. Cl.
*H01L 41/00* (2006.01)
*H02N 2/00* (2006.01)
*H01B 13/00* (2006.01)
(52) U.S. Cl. .................. 310/340; 310/363; 310/364; 310/365; 310/366; 216/13
(58) Field of Classification Search ................ 216/13; 310/340, 363–366; 29/25.35
See application file for complete search history.

(56) References Cited

U.S. PATENT DOCUMENTS

| 5,714,917 | A | 2/1998 | Ella |
| 6,617,249 | B2 | 9/2003 | Ruby et al. |
| 6,812,473 | B1 | 11/2004 | Amemiya |
| 6,839,946 | B2 * | 1/2005 | Ylilammi et al. .......... 29/25.35 |
| 6,903,491 | B2 * | 6/2005 | Irie et al. ................ 310/328 |

FOREIGN PATENT DOCUMENTS

| JP | 58-137317 | 8/1983 |
| JP | 58-153412 | 9/1983 |
| JP | 60-171822 | 9/1985 |

(Continued)

OTHER PUBLICATIONS

English language Abstract of JP 2001-251159.

(Continued)

*Primary Examiner*—Nadine Norton
*Assistant Examiner*—Mahmoud Dahimene
(74) *Attorney, Agent, or Firm*—Greenblum & Bernstein, P.L.C.

(57) ABSTRACT

A method of manufacturing a piezoelectric thin film resonator forms, after forming a piezoelectric film on a substrate so as to cover a lower electrode formed on the substrate, an electrode material layer for forming an upper electrode above the piezoelectric film, forms a mask of a predetermined form on the electrode material layer, and then etches the electrode material layer to form the upper electrode. Before a step of forming the electrode material layer, a protective layer for protecting the piezoelectric film during etching of the electrode material layer is formed so as to cover at least a part of the piezoelectric film where the upper electrode is not formed, and the electrode material layer is then formed so as to cover the protective layer.

15 Claims, 10 Drawing Sheets

FOREIGN PATENT DOCUMENTS

| | | |
|---|---|---|
| JP | 9-64683 | 3/1997 |
| JP | 10-126160 | 5/1998 |
| JP | 10-200354 | 7/1998 |
| JP | 2001-77013 | 3/2001 |
| JP | 2001-251159 | 9/2001 |
| JP | 2002-335141 | 11/2002 |
| JP | 2002-344280 | 11/2002 |

OTHER PUBLICATIONS

English language Abstract of JP 58-137317. No Date Available.
English language Abstract of JP 58-153412. No Date Available.
English language Abstract of JP 60-171822. No Date Available.
English language Abstract of JP 9-64683. No Date Available.
English language Abstract of JP 10-200354. No Date Available.
English language Abstract and English Language Translation of Selected Portions of JP 10-126160. No date Available.
English language Abstract and English Language Translation of Selected Portions of JP 2002-335141.
English language Abstract and English Language Translation of Selected Portions of JP 2002-344280.
English language Abstract of JP 2001-77013.
English language Abstract of JP 10-126160. No Date Available.
English language Abstract of JP 2002-335141.
English language Abstract of JP 2002-344280.
English language computer-generated translation of JP 2002-344280.

* cited by examiner

METHOD OF MANUFACTURING A PIEZOELECTRIC THIN FILM RESONATOR, MANUFACTURING APPARATUS FOR A PIEZOELECTRIC THIN FILM RESONATOR, PIEZOELECTRIC THIN FILM RESONATOR, AND ELECTRONIC COMPONENT

BACKGROUND OF THE INVENTION

1. Field of the Invention

This invention relates to a method of manufacturing and a manufacturing apparatus for a piezoelectric thin film resonator in which a lower electrode, a piezoelectric film, and an upper electrode are formed in order on a substrate, a piezoelectric thin film resonator manufactured according to this method of manufacturing, and an electronic component constructed so as to include this piezoelectric thin film resonator.

2. Description of the Related Art

As one example of a piezoelectric thin film resonator manufactured according to this kind of method of manufacturing, a piezoelectric thin film element for use as a filter or the like in an electronic appliance, such as a mobile phone, is disclosed by Japanese Laid-Open Patent Publication No. 2001-251159. This piezoelectric thin film element is constructed by forming a lower electrode, a piezoelectric film, and an upper electrode in that order on a silicon substrate. In this case, the silicon substrate is a substrate for a piezoelectric thin film element with a silicon oxide film being formed on an upper surface thereof and a layer of a mask material being formed on a lower surface thereof. Also, a cavity for resonance is formed in the silicon substrate so that during driving, formed in the silicon substrate so that during driving, the lower electrode, the piezoelectric film and the upper electrode can resonate.

When manufacturing this piezoelectric thin film element, first a metal film for forming the lower electrode is formed on the silicon oxide film on the silicon substrate and etching is then carried out to leave parts of the metal film corresponding to the lower electrode and remove unnecessary parts, thereby forming the lower electrode. At this time, as one example, a mask is formed by forming a photoresist layer on the metal film and then exposing and developing the photoresist layer, and then etching is carried out using this mask. Next, the piezoelectric film is formed so as to cover the lower electrode by carrying out sputtering, for example, on the silicon substrate. After this, after the metal film for forming the upper electrode has been formed on the piezoelectric film, etching is carried out to leave parts of the metal film corresponding to the upper electrode and remove unnecessary parts, thereby forming the upper electrode. At this time, in the same way as when the lower electrode is formed, etching is carried out using a mask formed by exposing and developing a photoresist layer, for example. Next, etching is carried out with the mask material formed on the lower surface of the silicon substrate as a mask to form the resonance cavity. After this, by applying an organic resin material so as to cover the piezoelectric film and the upper electrode, an organic resin film is formed, thereby completing the piezoelectric thin film element.

However, by investigating the conventional method of manufacturing a piezoelectric thin film element, the inventors of the present invention discovered the following problem. That is, the conventional method of manufacturing forms the upper electrode by etching a metal film formed on the piezoelectric film. Accordingly, if the upper electrode is formed by wet etching, depending on the combination of the material forming the piezoelectric film and the metal(s) forming the upper electrode, when the etching liquid removes unnecessary parts of the metal film and contacts the surface of the piezoelectric film, the etching liquid for etching the metal film also etches the piezoelectric film. Also, if etching is completed just before the etching liquid starts to etch the piezoelectric film, some parts of the metal film that should be removed will definitely remain on the piezoelectric film. In this case, if the piezoelectric film is etched or parts of the metal film unintentionally remain, the electrical characteristics of the piezoelectric thin film element will not satisfy the desired characteristics for which the piezoelectric thin film element was designed. Accordingly, it is necessary to carry out etching so as to completely remove unnecessary parts of the metal film without etching the piezoelectric film. However, the time required to completely etch the metal film changes every time etching is carried out due to factors such as minute variations in the thickness of the metal film and changes in the temperature of the etching liquid. Accordingly, with the conventional method of manufacturing a piezoelectric thin film element, there is the problem that it is difficult to completely remove unnecessary parts of the metal film without etching the piezoelectric film when forming the upper electrode.

SUMMARY OF THE INVENTION

The present invention was conceived in view of the problem described above and it is a principal object of the present invention to provide a method of manufacturing and a manufacturing apparatus that can reliably manufacture a piezoelectric thin film resonator with desired electrical characteristics, a piezoelectric thin film resonator manufactured according to this method of manufacturing, and an electronic component constructed so as to include this piezoelectric thin film resonator.

To achieve the stated object, a method of manufacturing a piezoelectric thin film resonator according to the present invention forms, after forming a piezoelectric film on a substrate so as to cover a lower electrode formed on the substrate, an electrode material layer for forming an upper electrode above the piezoelectric film, forms a mask of a predetermined form on the electrode material layer, and then etches the electrode material layer to form the upper electrode, wherein before a step of forming the electrode material layer, a protective layer for protecting the piezoelectric film during etching of the electrode material layer is formed so as to cover at least a part of the piezoelectric film where the upper electrode is not formed, and the electrode material layer is then formed so as to cover the protective layer.

To achieve the stated object, a manufacturing apparatus for a piezoelectric thin film resonator according to the present invention is constructed so as to be capable of manufacturing a piezoelectric thin film resonator by forming, after forming a piezoelectric film on a substrate so as to cover a lower electrode formed on the substrate, an electrode material layer for forming an upper electrode above the piezoelectric film, forming a mask of a predetermined form on the electrode material layer, and then etching the electrode material layer to form the upper electrode, wherein the manufacturing apparatus is constructed so that before the electrode material layer is formed, a protective layer for protecting the piezoelectric film during etching of the electrode material layer is formed so as to cover at least a part of the piezoelectric film where the upper electrode is not formed and the electrode material layer is then formed so as to cover the protective layer.

According to the above method of manufacturing and manufacturing apparatus for a piezoelectric thin film resonator, before an upper electrode is formed, a protective layer is formed so as to cover at least a part of a piezoelectric film where the upper electrode is not formed, so that when the electrode material layer is etched, the piezoelectric film is protected from corrosion by the etching liquid, which makes it possible to avoid unnecessary etching of the piezoelectric film and to carry out a sufficient etching to completely remove parts of the electrode material layer that are not covered by the mask. Accordingly, since it is possible to avoid problems such as variations in the thickness of the piezoelectric film or parts of the electrode material layer and the like remaining on the piezoelectric film, it is possible to reliably and easily manufacture a piezoelectric thin film resonator with the desired electrical characteristics. In this case, by not forming the protective layer in parts where the upper electrode is formed and only forming the protective layer in non-formed parts, it is possible to manufacture a piezoelectric thin film resonator with a high coupling coefficient.

In this method of manufacturing a piezoelectric thin film resonator, the protective layer should preferably be formed with silicon oxide ($SiO_2$). According to this preferred aspect, it is possible to reliably protect the piezoelectric film from corrosion by an etching liquid for etching aluminum, gold, or the like.

In this method of manufacturing a piezoelectric thin film resonator, the piezoelectric film should preferably be formed with zinc oxide (SiO). According to this preferred aspect, it is possible to manufacture a piezoelectric thin film resonator with a large passing bandwidth in the filter characteristics. In this case, according to this method of manufacturing, the piezoelectric film is reliably protected by the protective layer, so that even in the case where the piezoelectric film is formed using ZnO that is easily corroded by acid, such as acetic acid, phosphoric acid, and nitric acid, included in the etching liquid, a piezoelectric thin film resonator with the desired electrical characteristics can be easily and reliably manufactured.

Also, according to this method of manufacturing a piezoelectric thin film resonator, the electrode material layer should preferably be formed with aluminum (Al) or gold (Au). According to this preferred aspect, it is possible to manufacture a piezoelectric thin film resonator with a sufficiently high resonance frequency. In addition by forming the electrode material layer with gold, it is possible to manufacture a piezoelectric thin film resonator with a low insertion loss for passing signals.

Also, according to this method of manufacturing and manufacturing apparatus for a piezoelectric thin film resonator, the upper electrode should preferably be formed by etching the electrode material layer by wet etching. According to this preferred aspect, it is possible to easily and reliably manufacture a piezoelectric thin film resonator using relatively simple manufacturing equipment.

Also, the piezoelectric thin film resonator according to the present invention is manufactured according to the above method of manufacturing a piezoelectric thin film resonator. This means that the piezoelectric thin film resonator can have the desired electrical characteristics.

Also, an electronic component according to the present invention is constructed so as to include the piezoelectric thin film resonator described above. This means that the electronic component can satisfy the desired electrical characteristics.

It should be noted that the disclosure of the present invention relates to a content of Japanese Patent Application 2003-094569 that was filed on Mar. 31, 2003 and the entire content of which is herein incorporated by reference.

BRIEF DESCRIPTION OF THE DRAWINGS

These and other objects and features of the present invention will be explained in more detail below with reference to the attached drawings, wherein.

DESCRIPTION OF THE PREFERRED EMBODIMENTS

Hereafter, preferred embodiments of a method of manufacturing and a manufacturing apparatus for a piezoelectric thin film resonator according to the present invention, a piezoelectric thin film resonator manufactured according to this method of manufacturing, and an electronic component constructed so as to include this piezoelectric thin film resonator will be described with reference to the attached drawings.

First, the construction of a piezoelectric thin film resonator 1 will be described with reference to the drawings.

Figure 1:
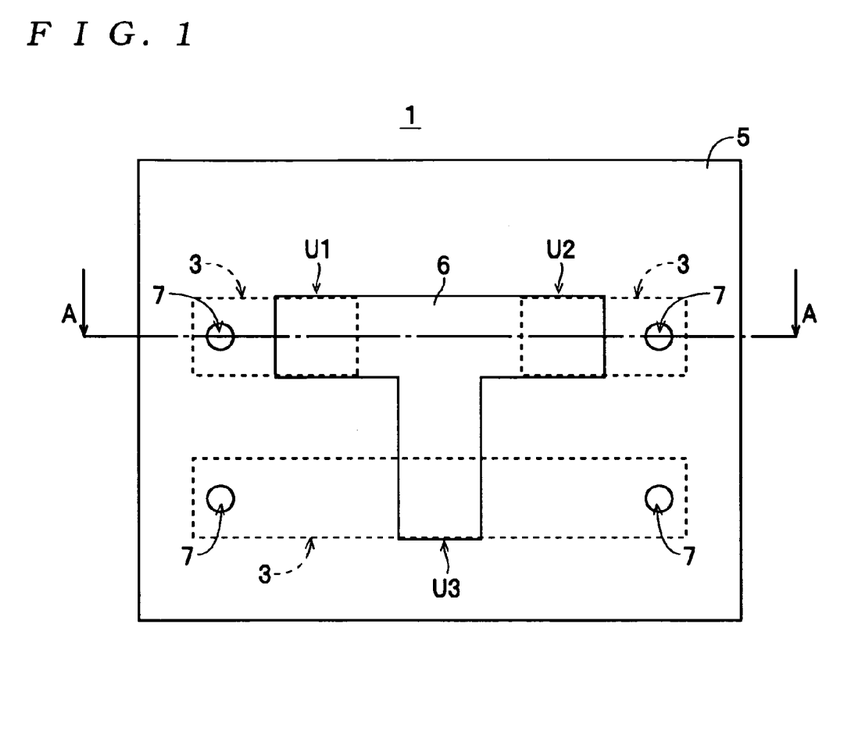
FIG. 1 is a plan view of a piezoelectric thin film resonator manufactured according to the method of manufacturing according to an embodiment of the present invention.
Figure 2:
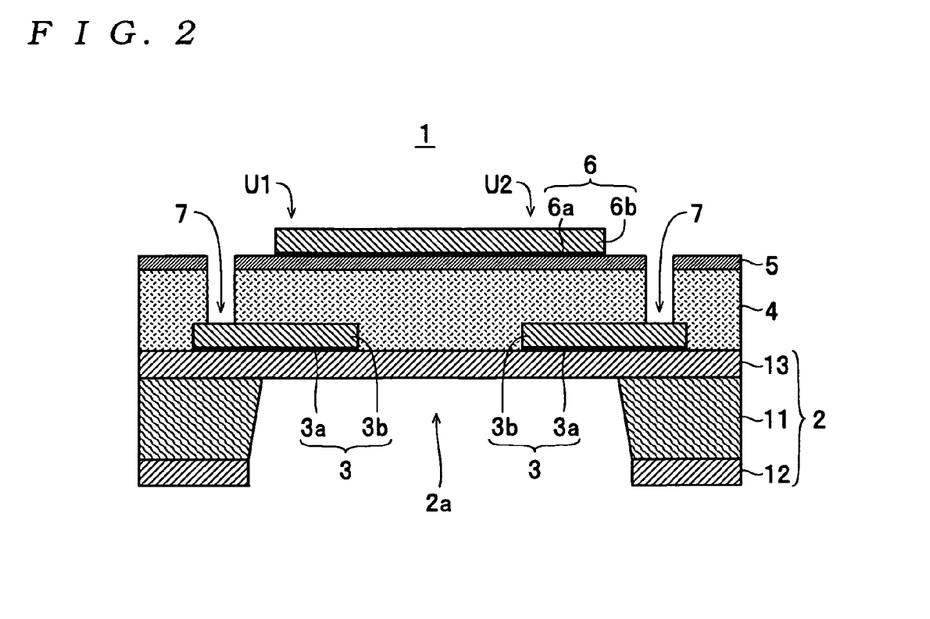
FIG. 2 is a cross-sectional view along a line A-A in FIG. 1 showing a layered construction of the piezoelectric thin film resonator.
Figure 3:
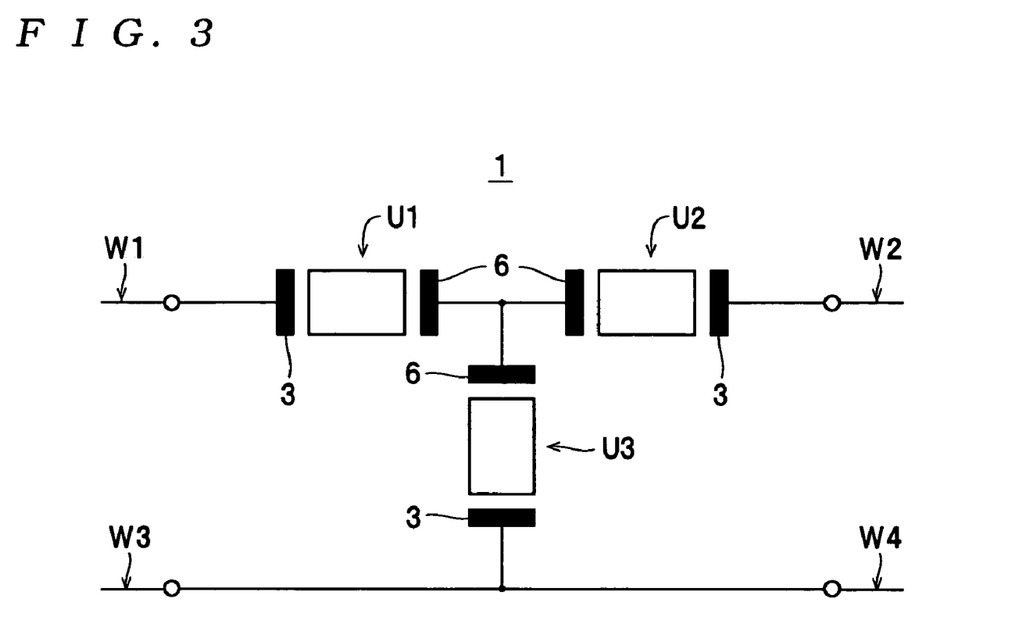
FIG. 3 is an equivalent circuit diagram of the piezoelectric thin film resonator.

The piezoelectric thin film resonator 1 shown in FIGS. 1 and 2 corresponds to the piezoelectric thin film resonator according to the present invention, and is constructed so as to include a substrate 2, lower electrodes 3, 3, 3, a piezoelectric film 4, a protective layer 5 and an upper electrode 6. In this case, the piezoelectric thin film resonator 1 is constructed so as to include three unit piezoelectric thin film resonators U1 to U3 (hereinafter collectively referred to as a unit piezoelectric thin film resonator U when no distinction is required). Here, a unit piezoelectric thin film resonator U refers to a construction element which includes a part between a lower electrode 3 and a part of the upper electrode 6 opposite that lower electrode 3 and which functions as a resonator when driven. More specifically, a unit piezoelectric thin film resonator U is constructed of a lower electrode 3, the upper electrode 6, and the piezoelectric film 4 and the protective layer 5 that include parts sandwiched between the electrodes 3 and 6, with these unit piezoelectric thin film resonators U also respectively constructing piezoelectric thin film resonators according to the present invention. That is, the piezoelectric thin film resonator according to the present invention is constructed by one unit piezoelectric thin film resonator U as the smallest unit, and can also be constructed of a plurality of unitary piezoelectric thin film resonators U. The piezoelectric thin film resonator 1 also functions as a filter as an electronic component according to the present invention, and if the three unit piezoelectric thin film resonators U1 to U3 are connected as shown in FIG. 3, the piezoelectric thin film resonator 1 can function as a series-parallel-series type filter. It should be noted that in FIG. 2 and FIGS. 5 to 24, the respective layers are illustrated with an exaggerated thickness for ease of understanding the present invention, and that the ratios of thicknesses between the respective layers differ to those used in reality.

The substrate 2 is a support substrate for supporting the multilayer structure composed of the lower electrodes 3, 3, 3, the piezoelectric film 4, the protective layer 5, and the upper electrode 6, and is constructed with a silicon substrate (bare silicon wafer) 11 formed with a thickness in a range of 100 μm to 3000 μm inclusive, and a lower barrier layer 12 and an upper barrier layer 13 respectively formed on the front and rear surfaces of the silicon substrate 11. In this case, in the piezoelectric thin film resonator 1, as one example a silicon substrate 11 formed with a thickness in a range of 200 μm to 500 μm inclusive is used, and the lower barrier layer 12 and the upper barrier layer 13 are formed with silicon nitride ($SiN_x$) or silicon oxide ($SiO_2$) in a range of 0.03 μm to 0.5 μm inclusive. Also, to prevent vibration of the lower electrodes 3, the piezoelectric film 4, the protective layer 5, and the upper electrode 6 from being impeded when the piezoelectric thin film resonator 1 is driven, a vibration space 2a is formed in the substrate 2.

The lower electrodes 3 are formed with a metal material such as Al, Pt, Au, Ag, Cr, Cu, or Ti with a thickness in a range of 0.03 μm to 1 μm inclusive. In this case, in the piezoelectric thin film resonator 1, as one example a thin film of chromium (Cr) is formed as a bonding layer, an electrode material layer 3b made of gold (Au) is then formed, and etching is carried out to form the lower electrodes 3. It should be noted that as the metal material used to form the lower electrodes 3 and the upper electrode 6 described later, in a case where ripples during driving are to be reduced, a metal material with a low Poisson's ratio and a low density (such as aluminum) should preferably be used. Also, when insertion loss for passing signals is to be reduced, a low resistance metal material (such as gold) should preferably be used. The piezoelectric film 4 is a thin layer with piezoelectric characteristics that is formed with zinc oxide (ZnO), lead zirconate titanate (Pb (Zr, Ti) $O_3$, also known as "PZT"), aluminum nitride (AlN), or the like, and is formed with a thickness of 5 μm or less. In this case, in the piezoelectric thin film resonator 1, as one example the piezoelectric film 4 is formed with zinc oxide (ZnO), which is known for its relatively high coupling coefficient, with a thickness of around 0.8 μm. Also, in the piezoelectric thin film resonator 1, four through-holes 7, 7, 7, 7 are formed so as to pass through the piezoelectric film 4 and the protective layer 5, and as shown in FIG. 3, bonding wires W1 to W4 or the like can be connected (bonded) to the surface of the lower electrodes 3.

The protective layer 5 is a layer for protecting the piezoelectric film 4 when a bonding layer 6a and an electrode material layer 6b (see FIGS. 16 and 17) are etched during formation of the upper electrode 6, and in the piezoelectric thin film resonator 1, as one example the protective layer 5 is formed so as to cover an entire upper surface of the piezoelectric film 4 with a thickness in a range of 5 nm to 300 nm, inclusive. In this case, a material suited to forming the protective layer 5 differs according to the method of forming the upper electrode 6. More specifically, when the upper electrode 6 is formed by wet etching, a (protective) material that can protect the piezoelectric film 4 from corrosion by the etching liquid for etching the electrode material layer 6b and the like is suitable, while when the upper electrode 6 is formed by dry etching, a (protective) material that can protect the piezoelectric film 4 from corrosion by the reactive gas for etching the electrode material layer 6b and the like is suitable. It should be noted that in the piezoelectric thin film resonator 1, as described later, since the upper electrode 6 is formed by wet etching a bonding layer 6a made of chromium and an electrode material layer 6b made of gold, in order to protect the piezoelectric film 4 from corrosion by the etching liquid used for such etching, as one example the protective layer 5 is formed with silicon oxide ($SiO_2$) with a thickness in a range of 10 nm to 100 nm, inclusive. In this case, the material for forming the protective layer 5 is not limited to silicon oxide and other materials such as aluminum oxide ($Al_2O_3$) and silicon nitride ($SiN_x$) can be used.

In the same way as the lower electrodes 3, the upper electrode 6 is formed with a metal such as Al, Pt, Au, Ag, Cr, Cu, or Ti in a thin film with a thickness in a range of 0.03 μm to 1 μm inclusive. In this case, in the piezoelectric thin film resonator 1, as one example the electrode material layer 6b made of gold (Au) is formed on a thin film of chromium (Cr) formed as the bonding layer 6a, and etching is carried out to form the upper electrode 6.

Next, the construction of a piezoelectric thin film resonator manufacturing apparatus 51 that manufactures the piezoelectric thin film resonator 1 will be described with reference to the drawings.

Figure 4:
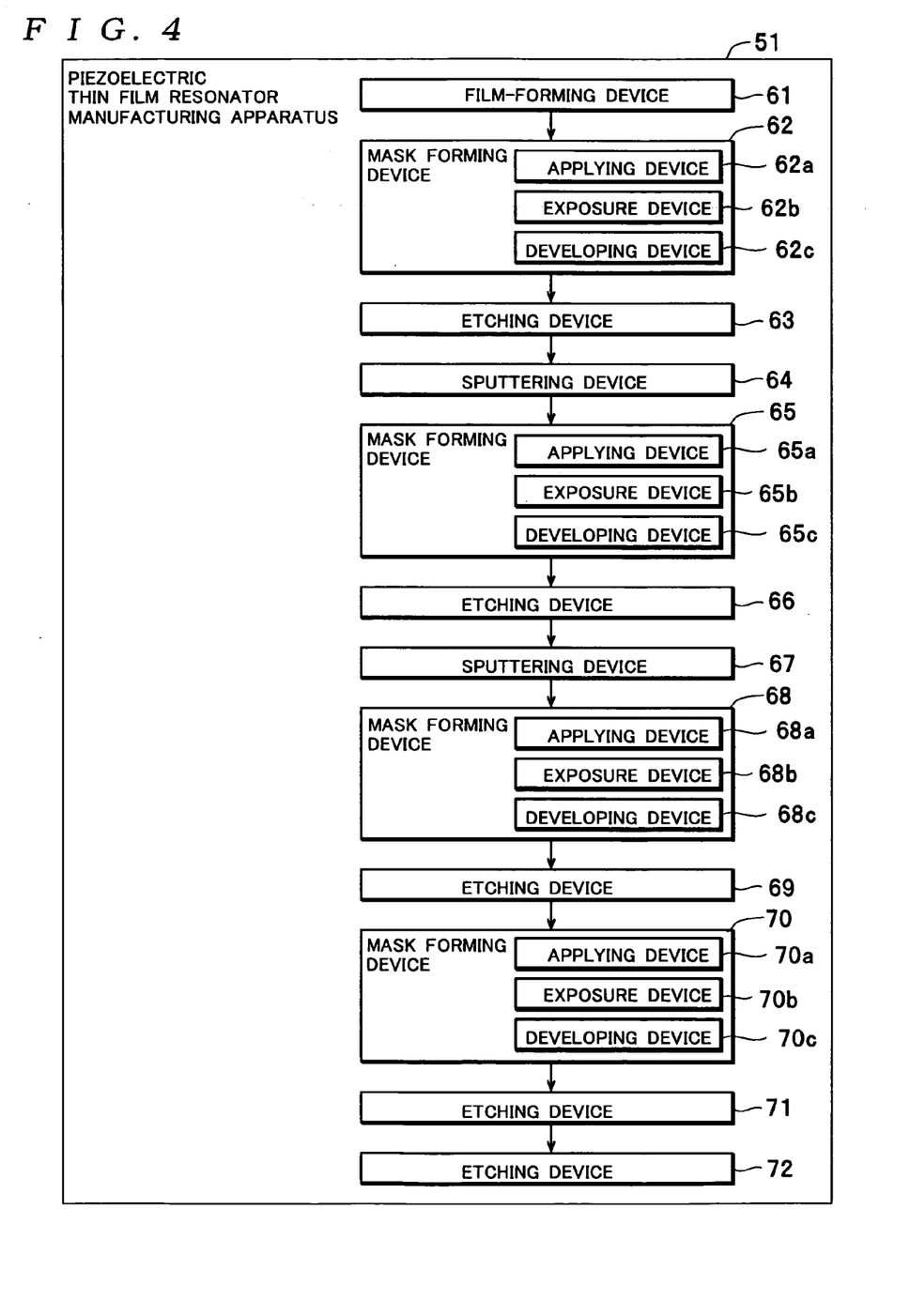
FIG. 4 is a block diagram showing the construction of a piezoelectric thin film resonator manufacturing apparatus that manufactures a piezoelectric thin film resonator.

The piezoelectric thin film resonator manufacturing apparatus (hereinafter simply "manufacturing apparatus") 51 shown in FIG. 4 is a manufacturing apparatus for manufacturing the piezoelectric thin film resonator 1, and is constructed so as to include a film forming device 61, mask forming devices 62, 65, 68, and 70, etching devices 63, 66, 69, 71, and 72, and sputtering devices 64 and 67. The film-forming device 61 attaches silicon nitride ($SiN_x$), for example, by chemical vapor deposition onto both front and rear surfaces of the silicon substrate 11 to form the lower barrier layer 12 and the upper barrier layer 13. The mask forming device 62 includes an applying device 62a, an exposure device 62b, and a developing device 62c, and forms a mask M1 (see FIG. 8) on a lower surface of the lower barrier layer 12. The etching device 63 etches the lower barrier layer 12 by reactive ion etching, for example. The sputtering device 64 forms the bonding layer 3a and the electrode material layer 3b by forming layers of chromium (Cr) and gold (Au) in order on an upper surface of the upper barrier layer 13. The mask forming device 65 includes an applying device 65a, an exposure device 65b, and a developing device 65c, and forms a mask M2 (see FIG. 11) on the electrode material layer 3b. The etching device 66 etches the electrode material layer 3b and the bonding layer 3a by wet etching to form the lower electrodes 3.

The sputtering device 67 forms the piezoelectric film 4 by forming a layer of zinc oxide (ZnO), for example, on the upper barrier layer 13 so as to cover the lower electrodes 3. Also, the sputtering device 67 forms the protective layer 5 by forming a layer of silicon oxide ($SiO_2$), for example, on the piezoelectric film 4. In addition, the sputtering device 67 forms the bonding layer 6a and the electrode material layer 6b by forming layers of chromium (Cr) and gold (Au) in order on the protective layer 5. The mask forming device 68 includes an applying device 68a, an exposure device 68b, and a developing device 68c, and forms a mask M3 (see FIG. 16) on the electrode material layer 6b. The etching device 69 etches the electrode material layer 6b and the bonding layer 6a by wet etching to form the upper electrode 6. The mask forming device 70 includes an applying device 70a, an exposure device 70b, and a developing device 70c, and forms a mask M4 (see FIG. 18) on the protective layer 5 so as to cover the upper electrode 6. The etching device 71 etches the protective layer 5 and the piezoelectric film 4 by wet etching using acetic acid, for example, to form the through-holes 7, 7, 7, 7, and the etching device 72 etches the silicon substrate 11 by wet etching using potassium hydroxide (KOH), for example, to form the vibration space 2a.

Next, the method of manufacturing the piezoelectric thin film resonator 1 will be described with reference to the drawings.

Figure 5:
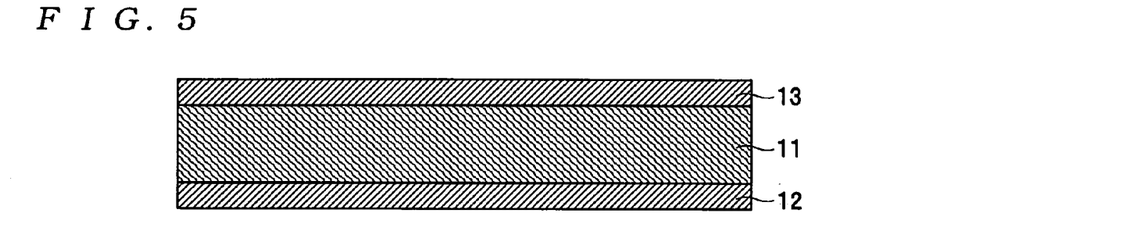
FIG. 5 is a cross-sectional view of a silicon substrate in a state where a lower barrier layer and an upper barrier layer have been respectively formed on a lower surface and an upper surface thereof.
Figure 6:
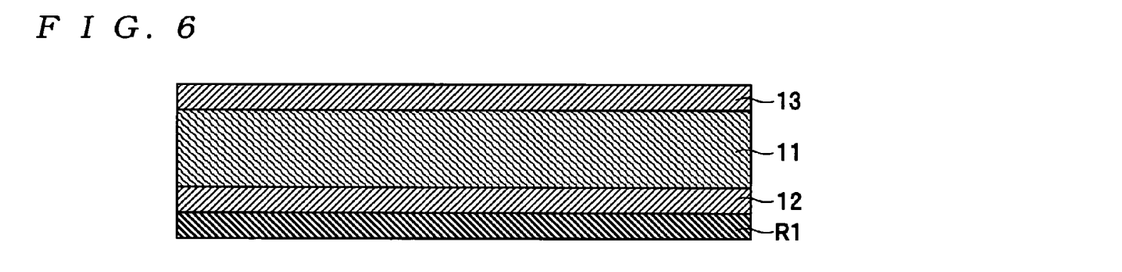
FIG. 6 is a cross-sectional view of a state where a resist layer has been formed on a lower surface of the lower barrier layer.
Figure 7:
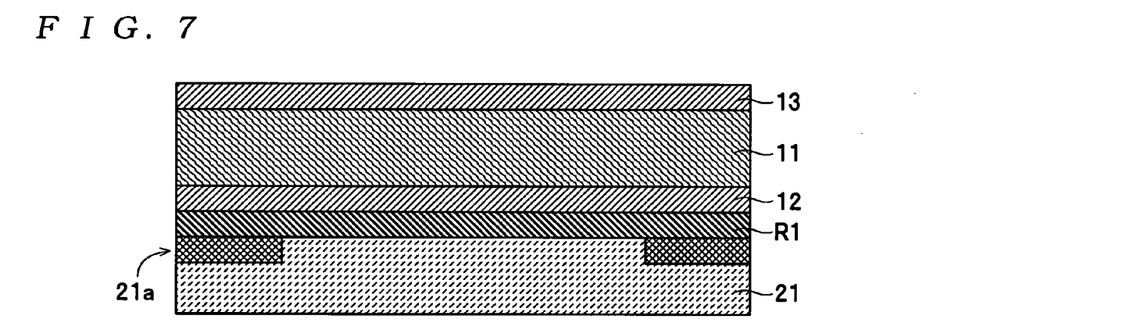
FIG. 7 is a cross-sectional view of a silicon substrate and a glass mask in a state where a glass mask on which a mask pattern has been drawn is placed in contact with a lower surface of the resist layer and exposure is carried out.
Figure 8:
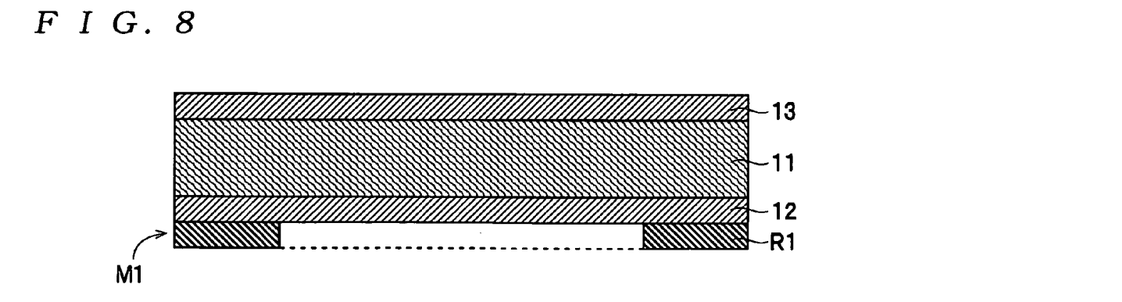
FIG. 8 is a cross-sectional view of a state where the resist layer has been developed to form a mask.
Figure 9:
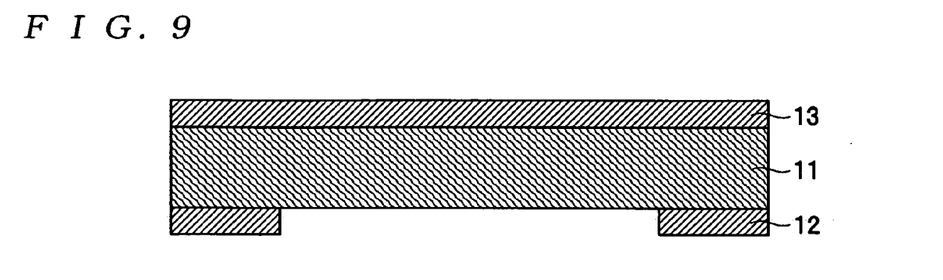
FIG. 9 is a cross-sectional view of a state where the lower barrier layer has been etched using the mask.

First, as shown in FIG. 5, the film-forming device 61 attaches silicon nitride ($SiN_x$) to the front and rear surfaces of the silicon substrate 11 to form the lower barrier layer 12 and the upper barrier layer 13. Next, as shown in FIG. 6, the applying device 62a of the mask forming device 62 applies a positive-type photoresist, for example, to form a resist layer R1 on a lower surface of the lower barrier layer 12. After this, as shown in FIG. 7, in a state where a glass mask 21 on whose surface a mask pattern 21a is formed by chromium (Cr), for example, has been brought into tight contact with the resist layer R1, the exposure device 62b irradiates UV rays in the direction shown by the arrow in FIG. 7 to form a latent image in (i.e., expose) the resist layer R1. Next, the developing device 62c develops the resist layer R1 in this state to form the mask M1 on the lower surface of the lower barrier layer 12 as shown in FIG. 8. After this, the etching device 63 etches the lower barrier layer 12. By doing so, as shown in FIG. 9, a central part of the lower barrier layer 12 (the part where the vibration space 2a will be formed later) is removed.

Figure 10:
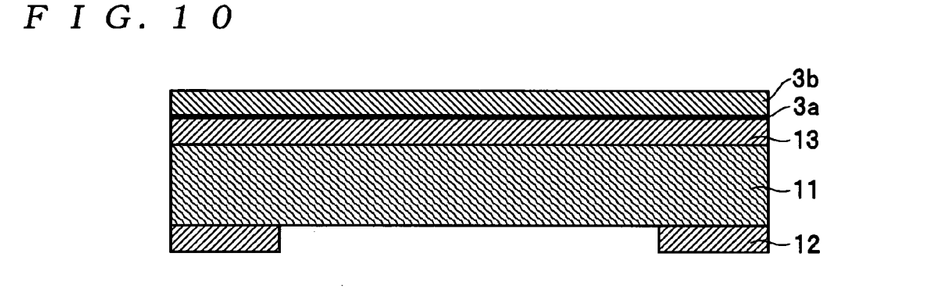
FIG. 10 is a cross-sectional view of a state where a bonding layer and an electrode material layer have been formed on an upper surface of the upper barrier layer.
Figure 11:
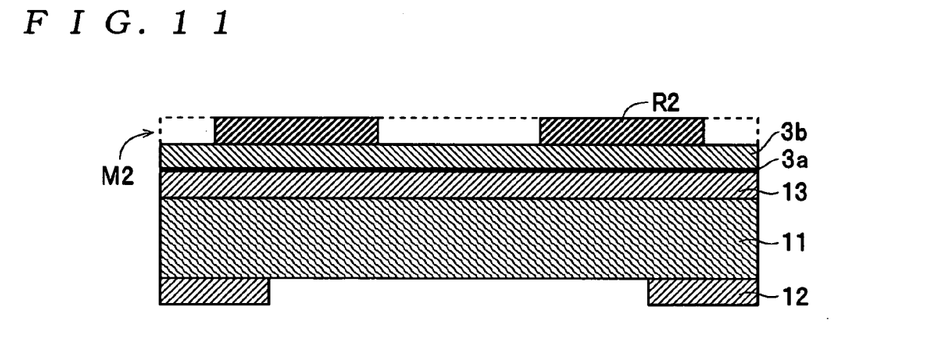
FIG. 11 is a cross-sectional view of a state where a mask has been formed on an upper surface of the electrode material layer.
Figure 12:
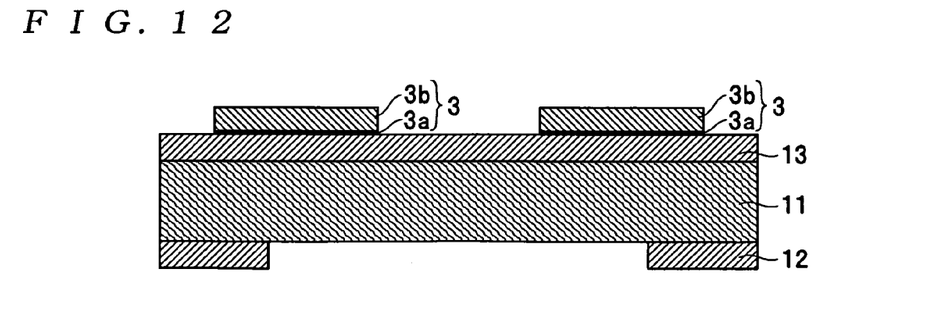
FIG. 12 is a cross-sectional view of a state where the bonding layer and the electrode material layer have been etched using the mask (i.e., a state where the lower electrodes have been formed)
Figure 13:
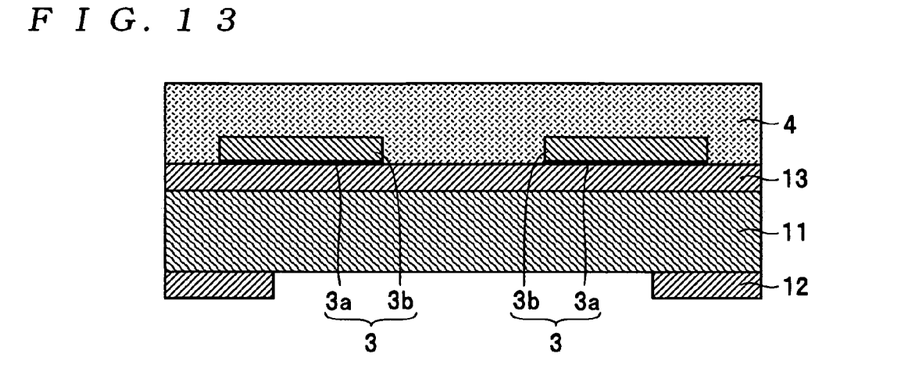
FIG. 13 is a cross-sectional view of a state where a piezoelectric film has been formed so as to cover the lower electrodes.

Next, as shown in FIG. 10, the sputtering device 64 forms layers of chromium (Cr) and gold (Au) in order so as to cover the entire upper surface of the upper barrier layer 13, thereby forming the bonding layer 3a with a thickness of around 10 nm and the electrode material layer 3b with a thickness of around 100 nm. After this, as shown in FIG. 11, the mask forming device 65 applies a photoresist onto the electrode material layer 3b to form the resist layer R2, and then carries out exposure and development to form the mask M2 on the electrode material layer 3b. Next, the etching device 66 etches the electrode material layer 3b and the bonding layer 3a. By doing so, as shown in FIG. 12, the lower electrodes 3 are formed on the upper barrier layer 13. Next, as shown in FIG. 13, the sputtering device 67 forms a layer of zinc oxide (ZnO), for example, on the upper barrier layer 13 so as to cover the lower electrodes 3, thereby forming the piezoelectric film 4 with a thickness of around 0.8 μm.

Figure 14:
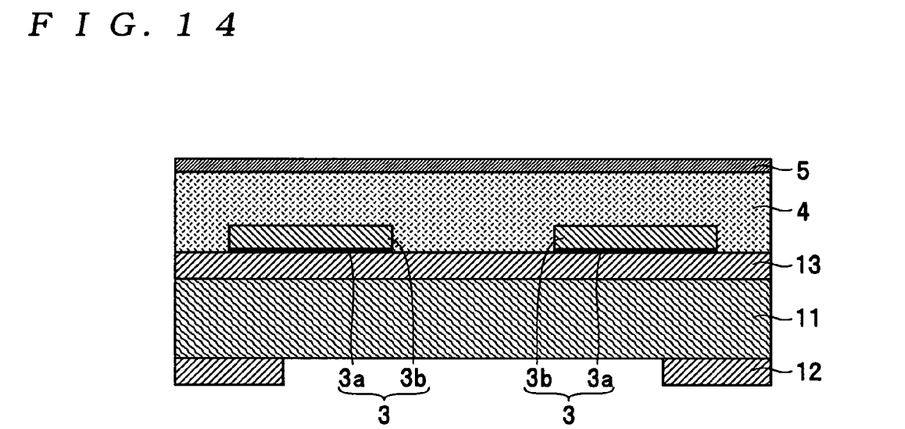
FIG. 14 is a cross-sectional view of a state where a protective layer has been formed on an upper surface of the piezoelectric film.

Next, as shown in FIG. 14, the sputtering device 67 forms a layer of silicon oxide ($SiO_2$), for example, so as to cover the entire upper surface of the protective layer 5, thereby forming the protective layer 5 with a thickness (as one example, 50 nm) in a range of 10 nm to 100 nm, inclusive. In this case, if the protective layer 5 is too thin, as described later it is difficult to protect the piezoelectric film 4 from corrosion by an etching liquid used when the etching device 69 forms (by etching) the upper electrode 6 as described later. Also, if the protective layer 5 is too thick, the coupling coefficient is lowered by the presence of the protective layer 5. Accordingly, it is necessary for the thickness of the protective layer 5 to be regulated in a range of 5 nm to 300 nm, inclusive, with the range of 10 nm to 100 nm, inclusive being preferable.

Figure 15:
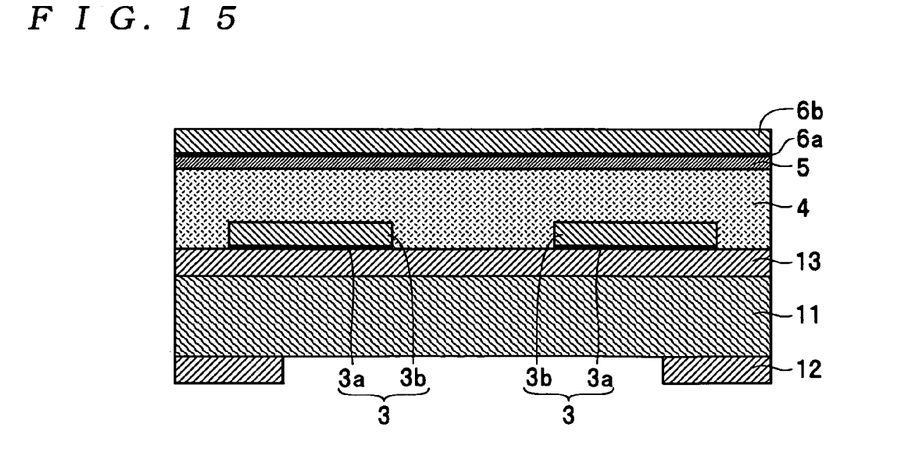
FIG. 15 is a cross-sectional view of a state where the bonding layer and the electrode material layer have been formed on an upper surface of the protective layer.
Figure 16:
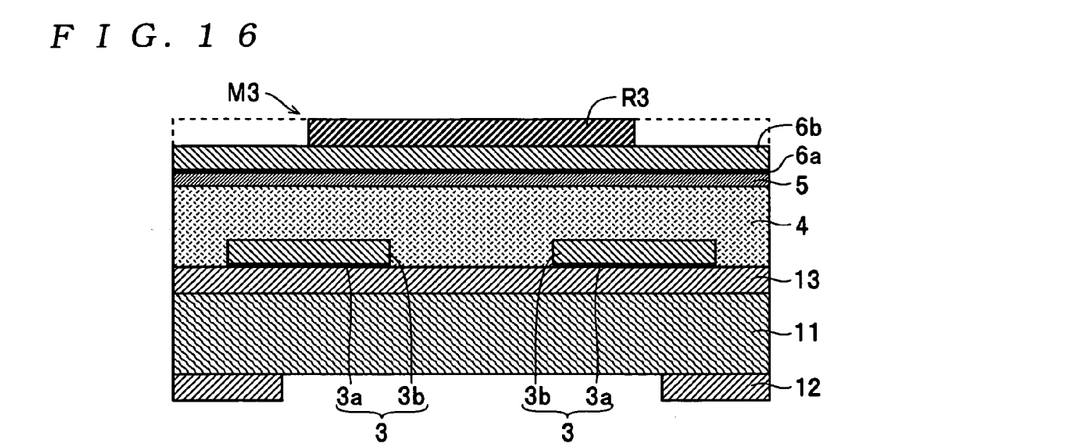
FIG. 16 is a cross-sectional view of a state where a mask has been formed on an upper surface of the electrode material layer.
Figure 17:
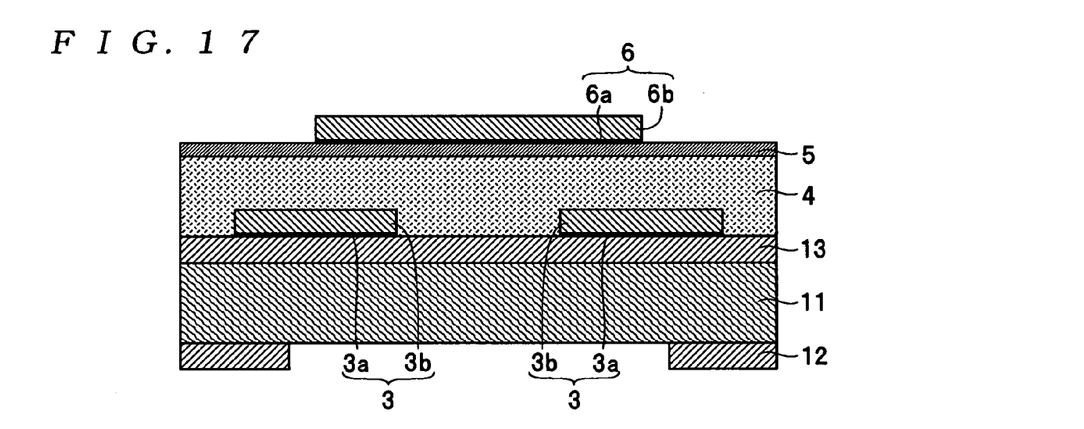
FIG. 17 is a cross-sectional view of a state where the bonding layer and the electrode material layer have been etched using the mask (i.e., a state where the upper electrode has been formed)

Next, as shown in FIG. 15, the sputtering device 67 forms layers of chromium (Cr) and gold (Au), for example, in order so as to cover the entire upper surface of the protective layer 5, thereby forming the bonding layer 6a that is around 10 nm thick and the electrode material layer 6b that is around 100 nm thick. After this, as shown in FIG. 16, the mask forming device 68 applies a photoresist onto the electrode material layer 6b to form the resist layer R3 and then carries out exposure and development to form the mask M3 on the electrode material layer 6b. Next, the etching device 69 etches the electrode material layer 6b and the bonding layer 6a. At this time, the piezoelectric film 4 is covered by the protective layer 5, so that even if sufficient soaking in etching liquid is carried out to etch the electrode material layer 6b and the bonding layer 6a exposed within the mask M3, corrosion of the piezoelectric film 4 due to the etching liquid is avoided. Accordingly, it is easy to carry out a sufficient soaking in the etching liquid so that parts of the electrode material layer 6b and the bonding layer 6a that should be removed do not remain, and as a result, as shown in FIG. 17, only the required upper electrode 6 can be formed on the protective layer 5 without unnecessary parts of the electrode material layer 6b and the like being left due to insufficient etching.

Figure 18:
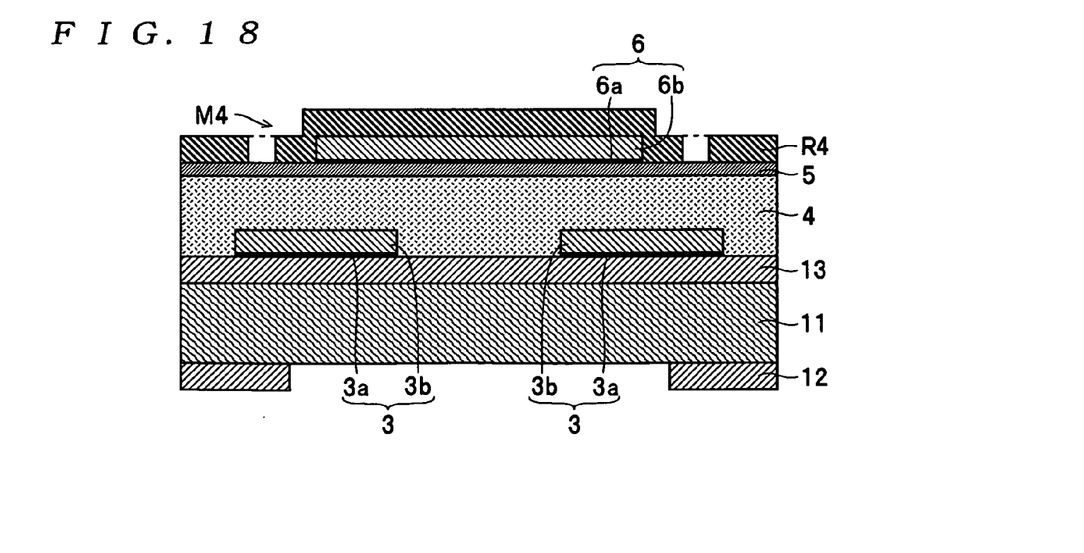
FIG. 18 is a cross-sectional view of a state where a mask has been formed so as to cover the upper electrode.
Figure 19:
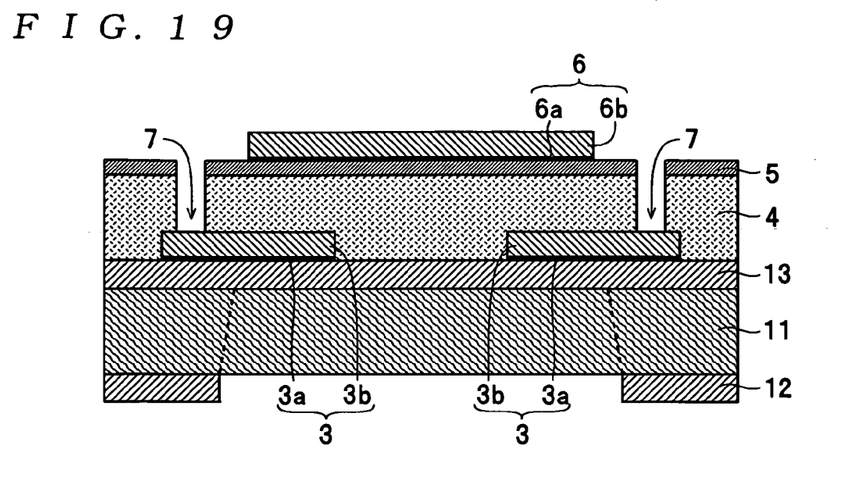
FIG. 19 is a cross-sectional view of a state where the protective layer and the piezoelectric film have been etched using the mask to form through-holes.

Next, as shown in FIG. 18, the mask forming device 70 applies a photoresist onto the protective layer 5 so as to cover the upper electrode 6, thereby forming the resist layer R4 and then carries out exposure and development to form the mask M4 on the protective layer 5. Next, as shown in FIG. 19, the etching device 71 etches the protective layer 5 and the piezoelectric film 4 to form the through-holes 7, 7, 7, 7. Next, the etching device 72 etches the silicon substrate 11 with the lower barrier layer 12 formed on the lower surface of the silicon substrate 11 as a mask. By doing so, the part shown by the broken line in FIG. 19 is removed to form the vibration space 2a, resulting in the piezoelectric thin film resonator 1 shown in FIG. 2 being completed.

In this way, according to the method of manufacturing the piezoelectric thin film resonator 1 using the manufacturing apparatus 51, before the bonding layer 6a and the electrode material layer 6b are formed (i.e., before the process forming the upper electrode 6), the protective layer 5 is formed so as to cover the entire upper surface of the piezoelectric film 4, so that when etching is carried out for the bonding layer 6a and the electrode material layer 6b, the piezoelectric film 4 is protected against corrosion by the etching liquid, so that while avoiding unnecessary etching of the piezoelectric film 4, etching can be carried out sufficiently so that parts of the electrode material layer 6b and the bonding layer 6a that are not covered by the mask M3 can be completely removed. Accordingly, it is possible to avoid problems such as variations in the thickness of the piezoelectric film 4 or parts of the electrode material layer 6b and the like remaining on the piezoelectric film 4, so that a piezoelectric thin film resonator 1 with the desired electrical characteristics can be easily and reliably manufactured. In addition, by constructing an electronic component, such as a filter, using this piezoelectric thin film resonator 1, it is possible to provide an electronic component that satisfies the desired electrical characteristics.

Also, according to the method of manufacturing the piezoelectric thin film resonator 1 using the manufacturing apparatus 51, by forming the protective layer 5 of $SiO_2$, it is possible to reliably protect the piezoelectric film 4 from corrosion by an etching liquid used to etch aluminum, gold, or the like.

In addition, according to the method of manufacturing the piezoelectric thin film resonator 1 using the manufacturing apparatus 51, by forming the piezoelectric film 4 of ZnO that has a relatively high coupling coefficient, it is possible to manufacture a piezoelectric thin film resonator 1 with a large passing bandwidth as filter characteristics. In this case, according to this method of manufacturing, since the piezoelectric film 4 is reliably protected by the protective layer 5, even in the case where the piezoelectric film 4 is formed using ZnO that is easily corroded by acid, such as acetic acid, phosphoric acid, and nitric acid, included in the etching liquid, a piezoelectric thin film resonator 1 with the desired electrical characteristics can be easily and reliably manufactured.

Also, according to the method of manufacturing the piezoelectric thin film resonator 1 using the manufacturing apparatus 51, by forming the electrode material layer 6b using gold that has superior conductivity, it is possible to manufacture a piezoelectric thin film resonator 1 with a low insertion loss for passing signals.

In addition, according to the method of manufacturing the piezoelectric thin film resonator 1 using the manufacturing apparatus 51, by forming the upper electrode 6 by etching the electrode material layer 6b and the bonding layer 6a by wet etching, it is possible to manufacture the piezoelectric thin film resonator 1 using relatively simple manufacturing equipment.

Figure 20:
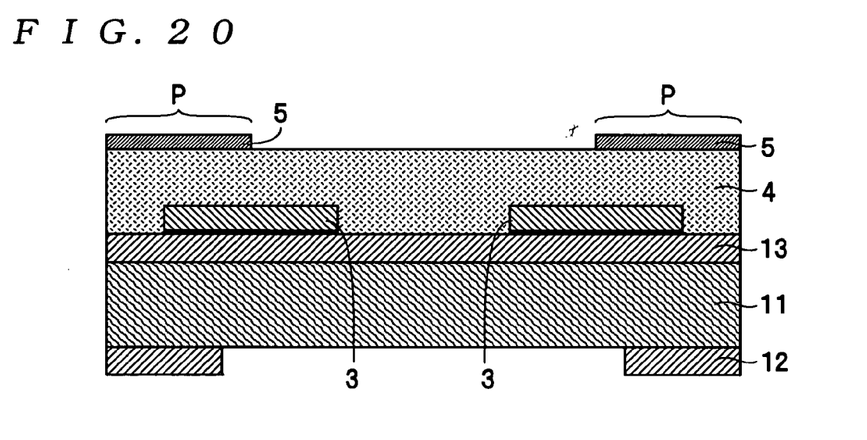
FIG. 20 is a cross-sectional view of a state where the protective layer has been formed in non-formed parts of an upper electrode on an upper surface of the piezoelectric film according to another embodiment of the present invention.
Figure 21:
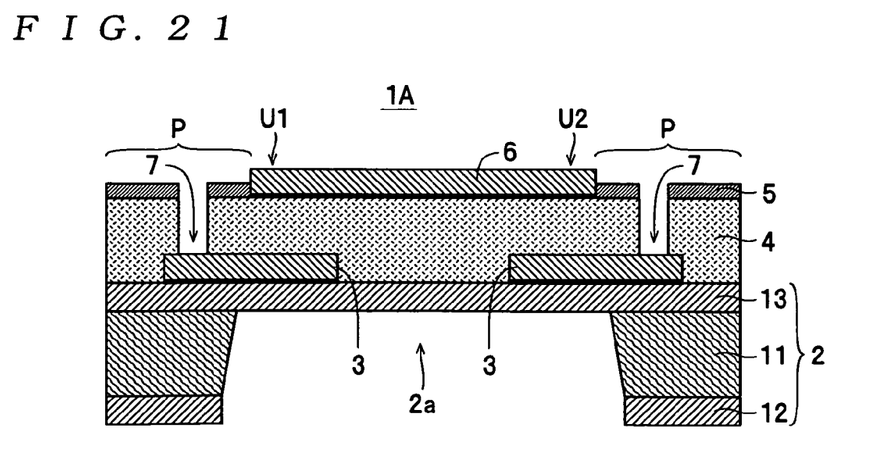
FIG. 21 is a cross-sectional view showing a layered construction of a piezoelectric thin film resonator manufactured according to another embodiment of the present invention.

It should be noted that the present invention is not limited to the above embodiment. For example, although a method of manufacturing that forms the protective layer 5 by covering the entire upper surface of the piezoelectric film 4 using the sputtering device 67 before the step of forming the bonding layer 6a and the electrode material layer 6b has been described in the above embodiment of the present invention, this is not a limitation of the present invention, and for example, as shown in FIG. 20, it is possible to use a method of manufacturing that forms the protective layer 5 by forming a layer of silicon oxide ($SiO_2$), for example, using the sputtering device 67 in only a part (also referred to as a "non-formed part" in the present specification) P (see FIGS. 20 and 21) where the upper electrode 6 will not be formed in a later process. According to this method of manufacturing, as shown by a piezoelectric thin film resonator 1A shown in FIG. 21, the protective layer 5 is not present between the upper electrode 6 and the piezoelectric film 4, so that it is possible to sufficiently reduce the thickness of the entire multilayer structure composed of the upper barrier layer 13, the lower electrodes 3, the piezoelectric film 4, and the upper electrode 6. This means that a piezoelectric thin film resonator 1A with a high resonance frequency can be manufactured. Also, since there is no protective layer between the upper electrode 6 and the piezoelectric film 4, the upper electrode 6 and the piezoelectric film 4 can directly contact one another, resulting in it being possible to manufacture a piezoelectric thin film resonator 1A with a high coupling coefficient.

Figure 22:
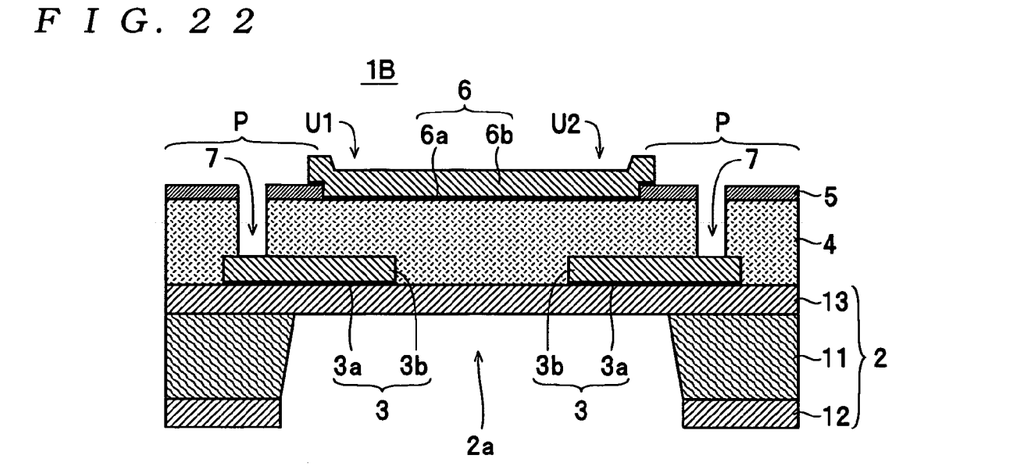
FIG. 22 is a cross-sectional view showing a layered construction of a piezoelectric thin film resonator manufactured according to another embodiment of the present invention.
Figure 23:
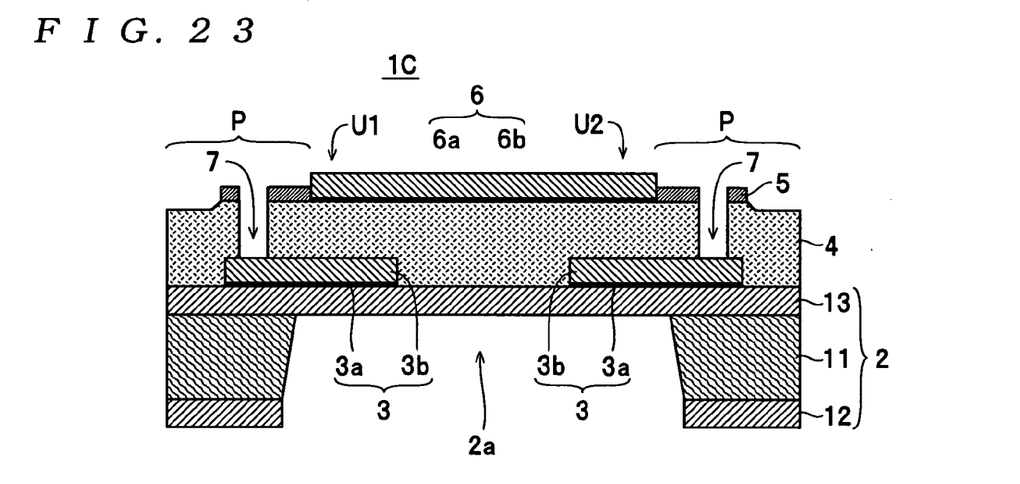
FIG. 23 is a cross-sectional view showing a layered construction of a piezoelectric thin film resonator manufactured according to another embodiment of the present invention.

In addition, when a method of manufacturing that forms the protective layer 5 only on the non-formed part P is used, it is preferable, as in a piezoelectric thin film resonator 1B shown in FIG. 22, to form the upper electrode 6 so that the end parts overlap the protective layer 5 by etching in a state where the end parts of the mask M3 formed on the electrode material layer 6b have been made slightly large so as to overlap the protective layer 5. According to this method of manufacturing, the protective layer 5 formed on the piezoelectric film 4 and the mask M3 formed on the electrode material layer 6b can reliably protect the piezoelectric film 4 from corrosion by the etching liquid in a vicinity of a boundary between the formed part and the non-formed part P of the upper electrode 6, so that a piezoelectric thin film resonator 1B with the desired electrical characteristics can be reliably manufactured. In addition, even when the method of manufacturing that forms the protective layer 5 only in the non-formed part P is used, the formation of the protective layer 5 in the entire non-formed part P is not a condition for the present invention. For example, as shown in FIG. 23, it is possible to form a piezoelectric thin film resonator 1C by forming the protective layer 5 in parts that can protect a relatively narrow region of the piezoelectric film 4 (a predetermined region of the piezoelectric film 4) including parts sandwiched between the lower electrodes 3 and the upper electrode 6, without forming the protective layer 5 in parts that do not affect the functions as a resonator.

Figure 24:
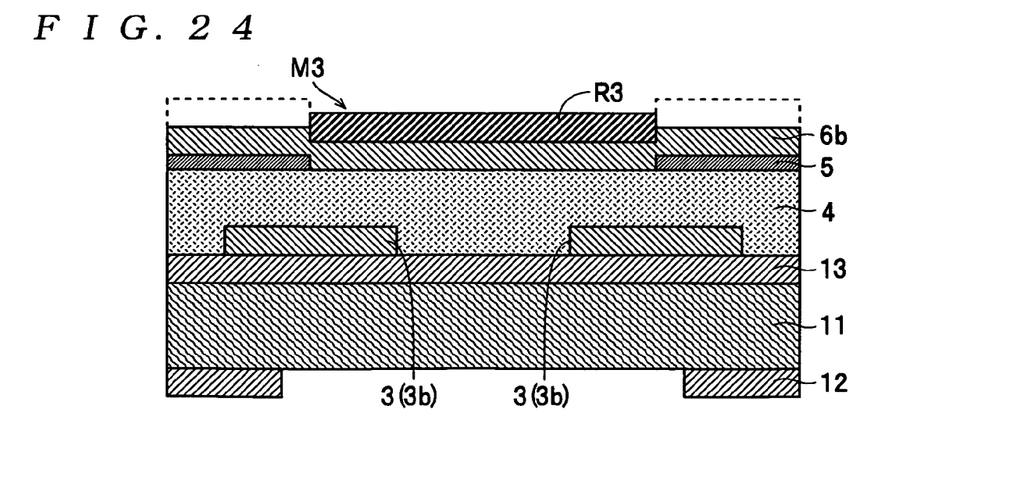
FIG. 24 is a cross-sectional view of a state where a mask has been formed on an upper surface of the electrode material layer according to a method of manufacturing according to another embodiment of the present invention.
Figure 25:
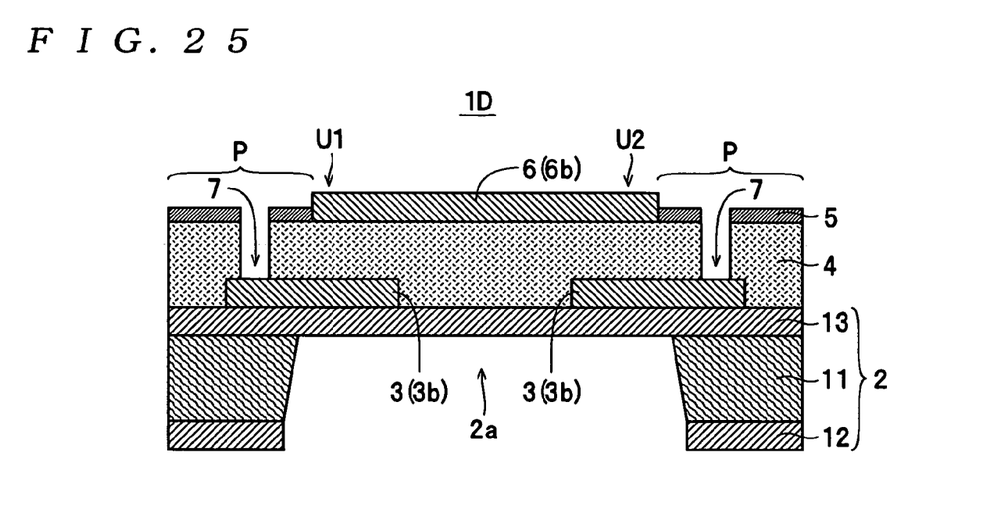
FIG. 25 is a cross-sectional view showing a layered construction of a piezoelectric thin film resonator manufactured according to a method of manufacturing according to another embodiment of the present invention.

Also, although a method of manufacturing in which the sputtering device 64 forms the lower electrodes 3 by forming the bonding layer 4a by forming a layer of chromium (Cr) and then forming the electrode material layer 3b by forming a layer of gold (Au) and the sputtering device 67 forms the upper electrode 6 by forming the bonding layer 6a by forming a layer of chromium (Cr) and then forming the electrode material layer 6b by forming a layer of gold (Au) has been described in the above embodiment of the present invention, the present invention is not limited to this. For example, it is possible to use a method of manufacturing a piezoelectric thin film resonator 1D in which as shown in FIG. 24, the sputtering device 64 forms the lower electrodes 3 by forming a layer of aluminum (Al), the etching device 66 then forms the lower electrodes 3 on the upper barrier layer 13 by etching this electrode material layer 3b, the sputtering device 67 forms the electrode material layer 6b by forming an aluminum (Al) layer so as to cover the protective layer 5, and as shown in FIG. 25, the etching device 69 then etches this electrode material layer 6b to form the upper electrode 6 on the piezoelectric film 4. According to this method of manufacturing, the aluminum that forms the lower electrodes 3 and the upper electrode 6 is light, so that it is possible to reliably and easily form a piezoelectric thin film resonator with a sufficiently high resonance frequency, for example.

In addition, according to the above embodiment of the present invention although a manufacturing apparatus 51 including the etching devices 66, 69 that form the lower electrodes 3 and the upper electrode 6 by wet etching has been described, the present invention is not limited to this, and it is possible to use a construction that forms the lower electrodes 3 and the upper electrode 6 using etching devices that etch the electrode material layers 3b, 6b and the bonding layers 3a, 6a using reactive ion gas (that is, etching by dry etching) in place of the etching devices 66, 69. When this construction is used, when layers are formed by the sputtering devices 64, 67, the protective layer 5 is formed using a material that can protect the piezoelectric film 4 from corrosion by the reactive ion gas used to etch the electrode material layer 6b (or the bonding layer 6a and the electrode material layer 6b).

Figure 26:
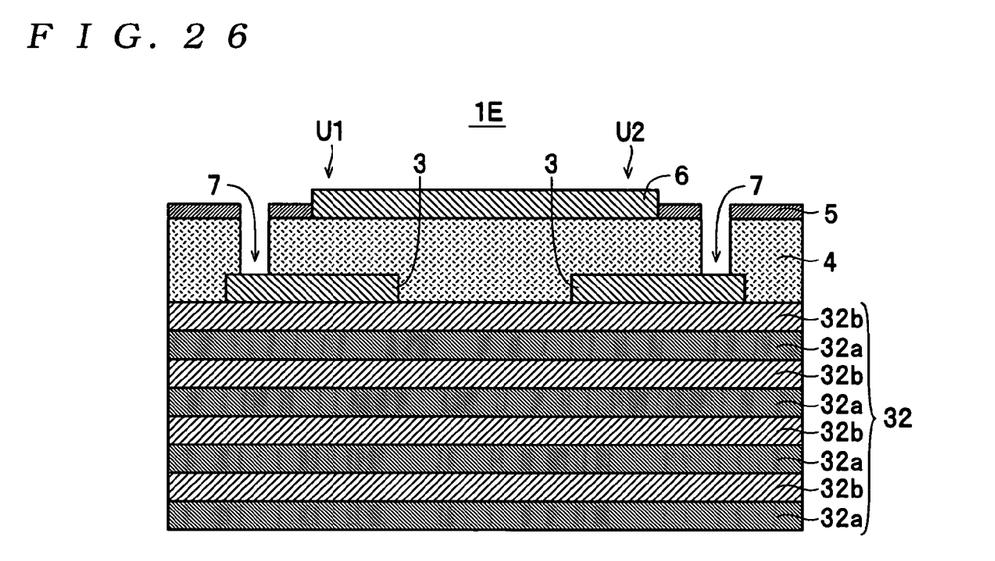
FIG. 26 is a cross-sectional view showing a layered construction of a piezoelectric thin film resonator manufactured according to a method of manufacturing according to another embodiment of the present invention.

Also, although a method of manufacturing in which the lower electrodes 3, the piezoelectric film 4, the protective layer 5, and the upper electrode 6 are formed on the substrate 2 composed of the silicon substrate 11, the lower barrier layer 12, and the upper barrier layer 13 has been described in the embodiment of the present invention, the structure of the substrate used in the method of manufacturing according to the present invention is not limited to this. For example, it is also possible to use a method of manufacturing that forms the lower electrodes 3, the piezoelectric film 4, the protective layer 5, and the upper electrode 6 on a substrate 32 (acoustic multilayer film) formed by alternately stacking aluminum nitride (AlN) thin films 32a and silicon oxide ($SiO_2$) thin films 32b, for example, as shown by the piezoelectric thin film resonator 1E shown in FIG. 26. According to this method of manufacturing, compared to the substrate 2 used in the method of manufacturing the piezoelectric thin film resonators 1, 1A to 1D described above, the strength of the substrate 32 can be increased by an amount corresponding to the increase in thickness of the unit piezoelectric thin film resonators U, so that it is possible to manufacture a piezoelectric thin film resonator 1E where breakage due to shocks and the like can be avoided.

In addition the various materials used in the method of manufacturing given in the above embodiments are merely examples, and the present invention is not limited to a method of manufacturing that uses these materials. The embodiments of the present invention have been described using an electronic component that functions as a series-parallel-series type ladder filter using the three unit piezoelectric thin film resonators U1 to U3, but an electronic component according to the present invention is not limited to being constructed as a filter but can be constructed as a duplexer. In this case, the number of unit piezoelectric thin film resonators used and the connection pattern is not limited to the example described in the embodiments of the present invention, and can be freely chosen. In addition, although the embodiments of the present invention have been described by way of the example piezoelectric thin film resonator 1 constructed with three unit piezoelectric thin film resonators U1 to U3, the piezoelectric thin film resonator according to the present invention is not limited to this and it is possible to construct a piezoelectric thin film resonator with one unit piezoelectric thin film resonator U or a piezoelectric thin film resonator with a plurality, such as two or at least four, unit piezoelectric thin film resonators U.

The invention claimed is:

1. A method of manufacturing a piezoelectric thin film resonator comprising: after forming a piezoelectric film on a substrate so as to cover a lower electrode formed on the substrate, forming an electrode material layer for forming an upper electrode above the piezoelectric film, forming a mask of a predetermined form on the electrode material layer, etching the electrode material layer to form the upper electrode, wherein before forming the electrode material layer, a protective layer for protecting the piezoelectric film during etching of the electrode material layer is formed so as to cover an entire upper surface of the piezoelectric film, and forming the electrode material layer so as to cover the protective layer, and wherein the upper electrode is formed on the protective layer.

2. A method of manufacturing a piezoelectric thin film resonator according to claim 1, wherein the protective layer is formed with silicon oxide ($SiO_2$).

3. A method of manufacturing a piezoelectric thin film resonator according to claim 1, wherein the piezoelectric film is formed with zinc oxide (ZnO).

4. A method of manufacturing a piezoelectric thin film resonator according to claim 1, wherein the electrode material layer is formed with aluminum (Al) or gold (Au).

5. A method of manufacturing a piezoelectric thin film resonator according to claim 1, wherein the electrode material layer is etched by wet etching to form the upper electrode.

6. A piezoelectric thin film resonator manufactured by, after forming a piezoelectric film on a substrate so as to cover a lower electrode formed on the substrate,
- providing an electrode material layer for forming an upper electrode above the piezoelectric film,
- forming a mask of a predetermined form on the electrode material layer, and
- etching the electrode material layer to form the upper electrode,
- wherein before providing the electrode material layer, a protective layer, for protecting the piezoelectric film during etching of the electrode material layer, is formed so as to cover an entire upper surface of the piezoelectric film, and then providing the electrode material layer so as to cover the protective layer; and
- wherein the upper electrode is formed on the protective layer.

7. An electronic component constructed so as to include a piezoelectric thin film resonator according to claim 6.

8. The piezoelectric thin film resonator according to claim 6, wherein the protective layer comprises silicon oxide ($SiO_2$).

9. The piezoelectric thin film resonator according to a claim 6, wherein the piezoelectric film comprises zinc oxide.

10. The piezoelectric thin film resonator according to claim 6, wherein the electrode material layer comprises aluminum (Al) or gold (Au).

11. The piezoelectric thin film resonator according to claim 6, wherein the electrode material layer is etched by wet etching to form the upper electrode.

12. An electronic component constructed so as to include a piezoelectric thin film resonator according to claim 8.

13. An electronic component constructed so as to include a piezoelectric thin film resonator according to claim 9.

14. An electronic component constructed so as to include a piezoelectric thin film resonator according to claim 10.

15. An electronic component constructed so as to include a piezoelectric thin film resonator according to claim 11.

* * * * *